(12) United States Patent
Osawa (10) Patent No.: US 7,482,042 B2
(45) Date of Patent: Jan. 27, 2009

(54) FILM FORMING METHOD AND FILM FORMING APPARATUS

(75) Inventor: Atsushi Osawa, Kaisei-machi (JP)

(73) Assignee: FUJIFILM Corporation, Tokyo (JP)

( * ) Notice: Subject to any disclaimer, the term of this patent is extended or adjusted under 35 U.S.C. 154(b) by 478 days.

(21) Appl. No.: 11/235,140

(22) Filed: Sep. 27, 2005

(65) Prior Publication Data
US 2006/0068105 A1    Mar. 30, 2006

(30) Foreign Application Priority Data
Sep. 29, 2004    (JP)    ............................ 2004-284951

(51) Int. Cl.
*B29C 35/08*    (2006.01)
(52) U.S. Cl. .................. 427/598; 427/248.1; 427/421.1; 427/457
(58) Field of Classification Search .............. 427/248.1, 427/421.1, 457, 598; 118/620
See application file for complete search history.

(56) References Cited

U.S. PATENT DOCUMENTS

| | | | |
|---|---|---|---|
| 4,419,381 A * | 12/1983 | Yamazaki | .................. 427/576 |
| 5,820,678 A * | 10/1998 | Hubert et al. | ............... 118/690 |
| 6,331,330 B1 * | 12/2001 | Choy et al. | .................. 427/475 |
| 6,399,011 B1 * | 6/2002 | Staines | ........................ 264/427 |
| 2004/0026030 A1 * | 2/2004 | Hatono et al. | ............... 156/279 |

FOREIGN PATENT DOCUMENTS

| JP | 2003-342100 A | 12/2003 |
|---|---|---|
| JP | 2004-131363 A | 4/2004 |

OTHER PUBLICATIONS

T. Uchikoshi, et al., "Control of Crystalline Texture in Polycrystalline Alumina Ceramics by Electrophoretic Deposition in a Strong Magnetic Field", J. Mater. Res., vol. 19, No. 5, May 2004, p. 1487-1491, Material Research Society.

* cited by examiner

*Primary Examiner*—Alain L Bashore
(74) *Attorney, Agent, or Firm*—Sughrue Mion, PLLC (57) ABSTRACT

A film forming apparatus by which property values in a film formed by the AD method can be improved. The film forming apparatus includes: a chamber having a substrate stage for holding a substrate on which a film is to be formed; an aerosol generating unit for generating an aerosol by dispersing a raw material powder into a gas; a magnetic field applying device for applying a magnetic field to a flow path of the aerosol generated by the aerosol generating unit so as to orient crystal orientation in the raw material powder in an aerosol state; and an injection nozzle for spraying the aerosol applied with the magnetic field by the magnetic field applying device to the substrate so as to deposit the raw material powder, in which the crystal orientation is oriented, on the substrate.

**8 Cla

FILM FORMING METHOD AND FILM FORMING APPARATUS

BACKGROUND OF THE INVENTION

1. Field of the Invention

The present invention relates to a film forming method and a film forming apparatus, and specifically, to a film forming method and a film forming apparatus for spraying and depositing a raw material powder on a substrate or the like.

2. Description of a Related Art

Recent years, a technique of controlling crystal orientation in a solid material such as metal or ceramics in order to control and improve characteristics of the material has been attracting attention. For example, a functional material having an advantageous electric characteristic in a specific direction and a high-strength material strong in bending stress in a specific direction can be fabricated by orienting crystal grains. As a technique of fabricating such a functional material, an orientation control technique of performing treatment such as crystal growth, sol-gel deposition, HIP (hot isostatic pressing), or SIP (non-pressure sintering) in a strong magnetic field is known.

As a related art, Japanese Patent Application Publication JP-P2003-342100A discloses a method of controlling crystal orientation which method requires no pretreatment such as rapid quenching or rolling and is applicable not only to ferromagnetic material but also to non-magnetic metal, ceramics or organic material (page 1). In this method, crystal orientation of a material is controlled by reheating the material to solid-liquid coexistence temperature while applying a strong magnetic field thereto, or agitating the material in a solid-liquid coexistence temperature range in a coagulation process to separate crystal grains, and thereby, creating a condition in which individual crystal grains float in melt and freely rotate so as to rotate the crystal grains in a direction in which magnetization energy becomes the minimum.

Further, JP-P2004-131363A discloses a method of controlling crystal orientation to obtain a ceramics high-order structure having a single-layer or multi-layer, in which ceramics monocrystal particles are highly oriented, simply without requiring a mold or container for casting while enabling control of orientation and layer thickness of monocrystal particles (page 1). This method includes the steps of orienting individual particles in ceramics monocrystal particle suspension, which is formed by charging and dispersing particles in a solvent, by utilizing monocrystal magnetic anisotropy, and applying an electric field to the oriented suspension to deposit charged and oriented ceramic particles.

Furthermore, Uchikoshi et al., "Control of crystalline texture in polycrystalline alumina ceramics by electrophoretic deposition in a strong magnetic field" (J. Mater. Res., Vol. 19, No. 5, May 2004, pp. 1487-1491) discloses a principle of orientation control of a ceramics film by performing electrophoretic deposition in a strong magnetic field (page 1487).

However, according to JP-P2003-342100A or JP-P2004-131363A, since bulk material formation or film formation under high temperature environment or wet condition is mainstream, the steps are large in number, complicated, and troublesome. Further, when the fabricated functional material is applied to a device, a complicated step of forming a film pattern is further required. Accordingly, a method and an apparatus for more simply and easily manufacturing an orientation-controlled material are desired.

By the way, recent years, research on a film forming method called "aerosol deposition method" (hereinafter, also referred to as "AD method") has been conducted. The AD method is a method of forming a thin film on the order of micrometers to a thick film on the order of millimeters by generating an aerosol by dispersing a raw material powder in a gas, injecting it from a nozzle and spraying it on a substrate or the like. Here, the aerosol refers to fine particles of solid or liquid floating in a gas. The AD method is also called "injection deposition method" or "gas deposition method". In the AD method, film formation is performed in a mechanism that the raw material powder injected at a high speed collides against a lower layer, cuts into it and is crushed, and thus formed crushed surfaces adhere to the lower layer. This film formation mechanism is called "mechanochemical reaction", and this reaction enables formation of dense and strong films containing no impurity, at normal temperature and in a dry condition. According to the AD method, since the nozzle is used when the aerosol is injected, a desired pattern can be formed by adjusting the aperture diameter, aperture shape, or the like of the nozzle. Accordingly, new material development utilizing such a special film formation mechanism and adoption in various applications are expected.

However, there is a problem that a film formed by the AD method (hereinafter, also referred to as "AD film") falls short of property values such as piezoelectric performance of a bulk material having the same composition. Accordingly, development of a technique of improving property values of the AD film to surpass those of the bulk material or at least become equal to those of the bulk material is desired.

SUMMARY OF THE INVENTION

The present invention has been achieved in view of the above-described problems. An object of the present invention is to improve property values in a film formed by the AD method.

In order to solve the above-described problems, a film forming method according to one aspect of the present invention includes the steps of: (a) generating an aerosol by dispersing a raw material powder into a gas; (b) applying a magnetic field to a flow path of the aerosol generated at step (a) so as to orient crystal orientation in the raw material powder in an aerosol state; and (c) spraying the aerosol applied with the magnetic field at step (b) to the substrate so as to deposit the raw material powder, in which the crystal orientation is oriented, on a substrate.

Further, a film forming apparatus according to one aspect of the present invention includes: a chamber having holding means for holding a substrate on which a film is to be formed; aerosol generating means for generating an aerosol by dispersing a raw material powder into a gas; magnetic field applying means for applying a magnetic field to a flow path of the aerosol generated by the aerosol generating means so as to orient crystal orientation in the raw material powder in an aerosol state; and aerosol injecting means for spraying the aerosol applied with the magnetic field by the magnetic field applying means to the substrate so as to deposit the raw material powder, in which the crystal orientation is oriented, on the substrate.

According to the present invention, since the crystal orientation of the raw material powder is controlled by applying a magnetic field to the raw material powder in an aerosol state, the crystal orientation in the AD film deposited on the substrate can be orientated in a desired orientation. Therefore, the property values of the AD film can be raised.

DESCRIPTION OF THE PREFERRED EMBODIMENTS

Hereinafter, preferred embodiments of the present invention will be described in detail by referring to the drawings. The same reference numerals are assigned to the same component elements and the description thereof will be omitted.

Figure 1:
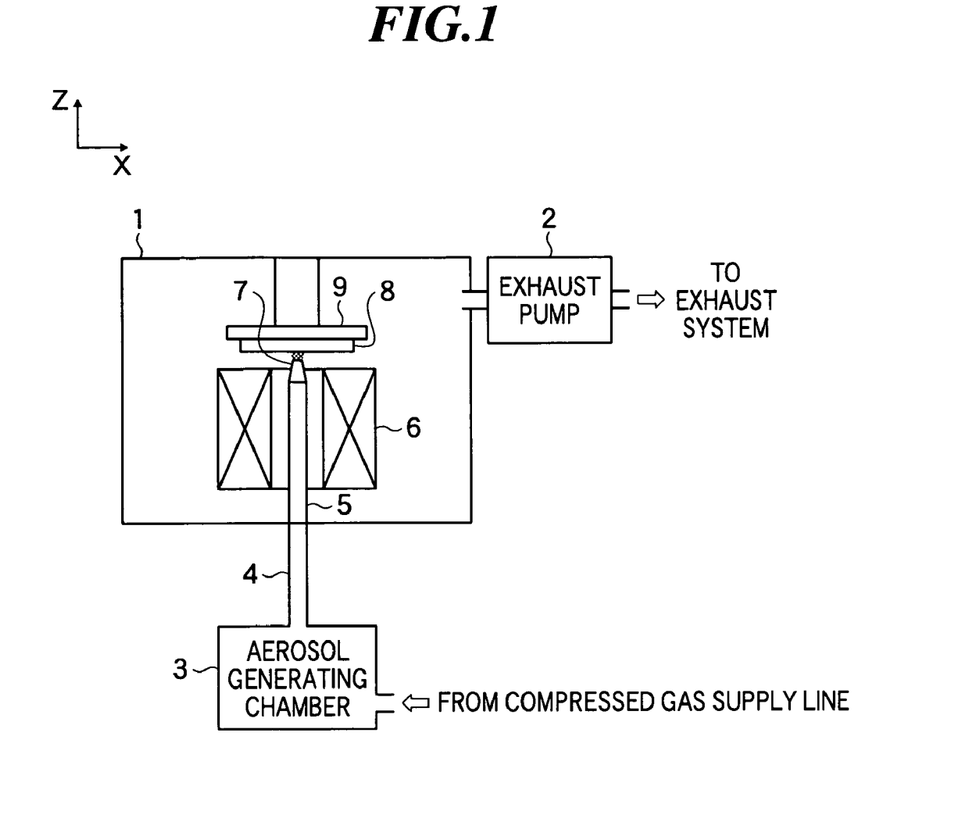
FIG. 1 is a schematic diagram showing a film forming apparatus according to the first embodiment of the present invention.

FIG. 1 is a schematic diagram showing a film forming apparatus according to the first embodiment of the present invention. This film forming apparatus uses the aerosol deposition (AD) method of spraying and depositing a raw material powder (film formation material powder) on a lower layer, and includes a chamber 1 in which film formation is performed, an exhaust pump 2, an aerosol generating chamber 3, an aerosol transport line 4, an accelerating tube 5, a superconducting coil 6, an injection nozzle 7, and a substrate stage 9 for holding a substrate 8. Among those, the superconducting coil 6 is part of a superconducting magnet as a magnetic field application device provided in the film forming apparatus, and a cooling unit as another component element of the superconducting magnet, a power supply unit for supplying current to the coil, etc. are omitted in FIG. 1.

The exhaust pump 2 maintains the pressure within the chamber 1 at predetermined pressure by exhausting air within the chamber 1.

The aerosol generating chamber 3 is a container in which a raw material powder is to be placed. The raw material powder used in the embodiment is desirably in a monocrystal state. For example, when a film of PZT (Pb(lead) zirconate titanate) as oxide ceramics or barium titanate (TiBaO$_3$) is formed, a monocrystal powder having an average particle diameter of about 0.1 μm to 1.0 μm is used. Regarding the particle diameter of the raw material powder, the condition within the above range is typically favorable, however, other than that, various ranges may be selected according to the apparatus, conditions of aerosol generated there and so on.

A compressed gas supply line such as a compressed gas cylinder is connected to the aerosol generating chamber 3, and a carrier gas such as nitrogen (N$_2$), oxygen (O$_2$), helium (He), argon (Ar), dry air, or the like is introduced therefrom. Thereby, in the aerosol generating chamber 3, the raw material powder is blown up and dispersed into an aerosol state. Thus generated aerosol is introduced into the accelerating tube 5 provided in the chamber 1 via the aerosol transport line 4.

The accelerating tube 5 supplies the aerosol introduced via the aerosol transport tube 4 to the injection nozzle 7 while accelerating it due to air pressure difference between the aerosol generating chamber 3 and the chamber 1.

The superconducting coil 6 is formed by an aluminum (Al) wire, for example, and provided around the accelerating tube 5. When current is supplied to the superconducting coil and the coil is cooled to absolute temperature of 4K or less, the coil becomes a superconductor having no electric resistance. Thereby, large current flows in the coil and a strong magnetic field (e.g., on the order of 10 teslas) is produced in broad space containing the accelerating tube 5. As a result, a magnetic field in a perpendicular direction (Z-direction) relative to a main surface of the substrate 8, for example, is applied to the aerosol passing through the accelerating tube 5.

The injection nozzle 7 has an aperture having a predetermined diameter. The injection nozzle 7 injects the aerosol that has been accelerated while passing through the accelerating tube 5 from the aperture toward a desired area of the substrate 8.

The substrate stage 9 is a movable stage for three-dimensionally moving while holding the substrate 8. A film can be formed in a desired area of the substrate 8 by moving the substrate state 9 to change the relative position between the substrate 8 and the injection nozzle 7.

Next, the principle of a film forming method to be used in the film forming apparatus according to the embodiment will be described by referring to FIGS. 2A and 2B.

In general, a magnetic material that forms a crystal structure other than a cubic crystal has anisotropy that ease of magnetization differs according to crystal orientation (crystal magnetic anisotropy). That is, magnetic susceptibility $\chi_{PARA}$ when a magnetic field parallel to one of major axes of a crystal is applied is different from $\chi_{PERPEND}$ when a magnetic field perpendicular to the major axis is applied, and there is a direction of easy magnetization. Here, the direction of easy magnetization refers to a direction in which a crystal is easily magnetized. For example, regarding α-Al$_2$O$_3$ as a kind of ceramic, the direction of easy magnetization is c-axis direction. The energy difference ΔE corresponding to the difference in ease of magnetization according to the crystal orientation is expressed by the following equation.

$$\Delta E = (\chi_{PARA} - \chi_{PERPEND}) V B^2 / 2 \mu_0 \quad (1)$$

Figure 2A:
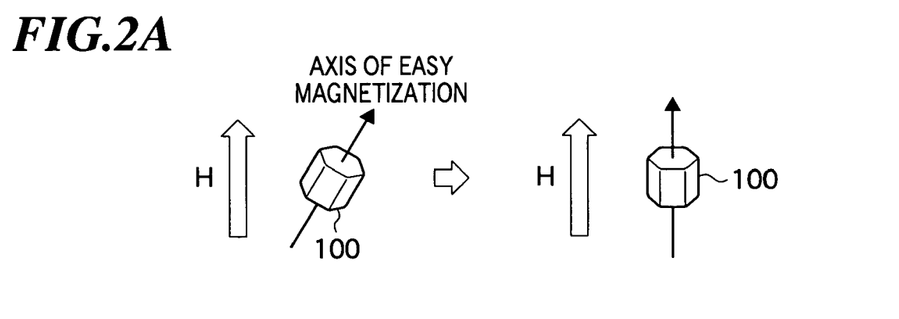
FIGS. 2A and 2B are diagrams for explanation of the principle of a film forming method used in the film forming apparatus shown in FIG. 1.

In equation (1), V is a volume of a monocrystal particle, B is magnetic flux density by an applied magnetic field, and $\mu_0$ is magnetic permeability. 1s As shown in FIG. 2A, when magnetic field H is applied to a monocrystal particle 100 having crystal magnetic anisotropy, if the energy difference ΔE becomes larger than thermal perturbation energy kT (k: Boltzmann constant, T: absolute temperature) of the crystal (ΔE>kT), torque for rotating the monocrystal particle 100 is produced in order to align the axis of easy magnetization in the direction of the magnetic field H and reduce the crystal magnetic anisotropy energy (internal energy).

Figure 2B:
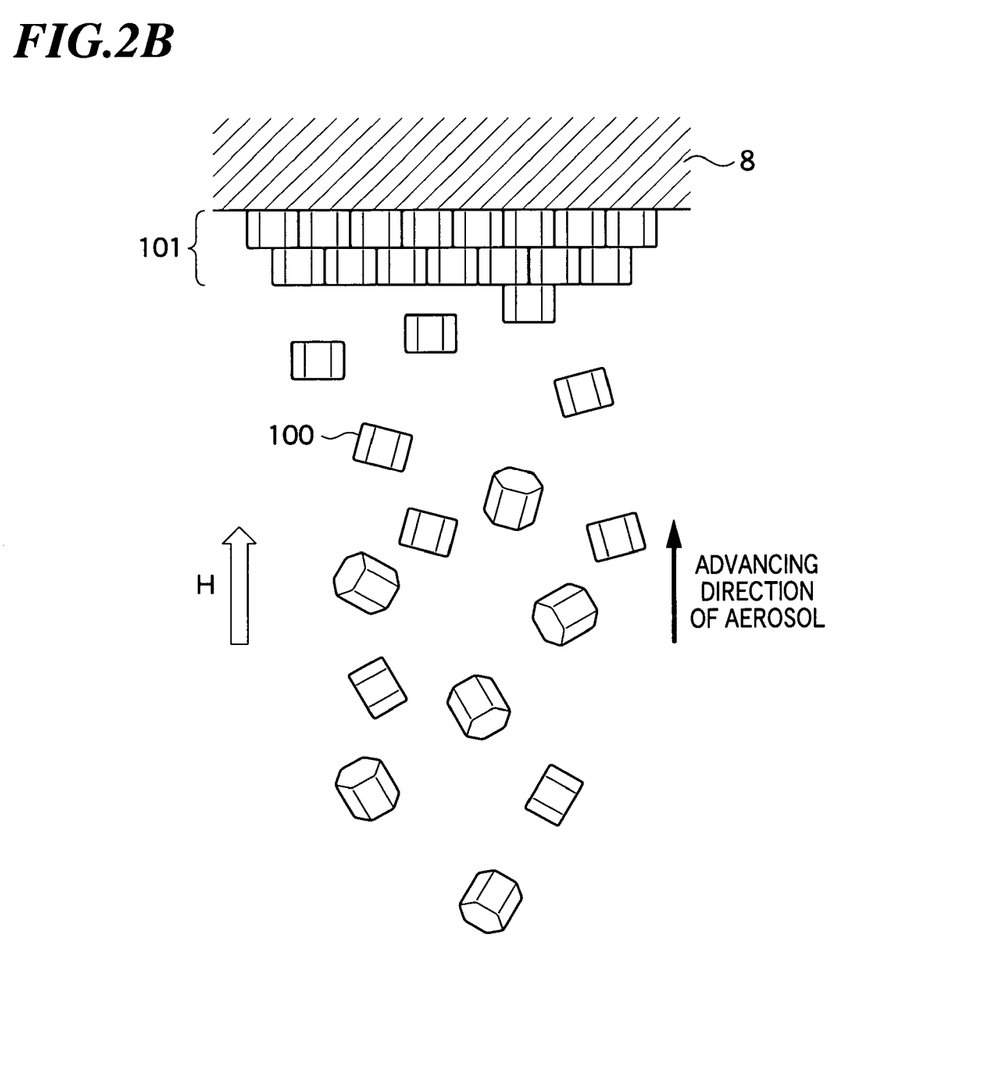

Accordingly, as shown in FIG. 2B, the magnetic field H is applied to the raw material powder of monocrystals in the aerosol state such that the above condition is satisfied, and thereby, the orientation of the respective monocrystals can be aligned. Such aerosol is sprayed onto the substrate 8 and the raw material powder is deposited thereon, and thereby, a film 101, in which crystal orientation is oriented, is formed.

As described above, in the embodiment, application of magnetic field to the raw material powder in the aerosol state can provide crystal orientation to the dense and strong film formed by the AD method. Therefore, while utilizing the advantage of the AD method capable of forming a pattern at normal temperature in a dry condition, the functionality of the film can be easily improved. For example, in the case where a piezoelectric film containing PZT or $BaTiO_3$ is formed, since polarization easily occurs when the crystal orientation in which the piezoelectric performance develops is aligned, the piezoelectric performance can be improved.

Further, even if a material has weak piezoelectric performance and is conventionally unsuitable for practical use, piezoelectric performance of that material can be improved by using the film forming apparatus according to the embodiment. Thereby, it can be expected to create non-zinc piezoelectric materials that surpass the currently predominant zinc piezoelectric materials such as PZT. Specifically, there is a possibility that piezoelectric performance is significantly improved in $BaTiO_3$ materials, $K_{0.5}N_{0.5}NbO_3$ materials, $BiNaTiO_3$ materials (for example, BNBT-6, BNBT-5.5), $BaSrNaNb_5O_{15}$, $Ba_2NBiNb_5O_{15}$, $Na_{0.5}Bi_{0.5}CaBi_4Ti_4O_{15}$-5, $KNbO_3$, etc.

Here, in the embodiment, a superconducting magnet is used for forming a magnetic field to be applied to an aerosol. The reason is that: since the magnetic susceptibility $\chi$ of paramagnetic material such as ceramics is smaller than that of ferromagnetic material or ferrimagnetic material, it is necessary to form a strong magnetic field such that the magnetic flux density (B) becomes equal to 10 teslas or more, for example, in order to make the torque $\Delta E$ expressed by equation (1) larger than the thermal perturbation energy kT. However, in the case where a material having large magnetic susceptibility $\chi$ such as ferromagnetic material or ferrimagnetic material is employed as a raw material powder, there is no need to form such strong magnetic field, and it is sufficient to cause a magnetic flux density (B) of two to three teslas, for example. Accordingly, in this case, a typical electromagnet or a permanent magnet such as a neodium magnet maybe used. Thereby, the constitution of the film forming apparatus can be simplified and downsized.

In the embodiment, a magnet of coil type for forming a magnetic field is available at a relatively low price, and the apparatus can be formed at low cost.

Figure 3:
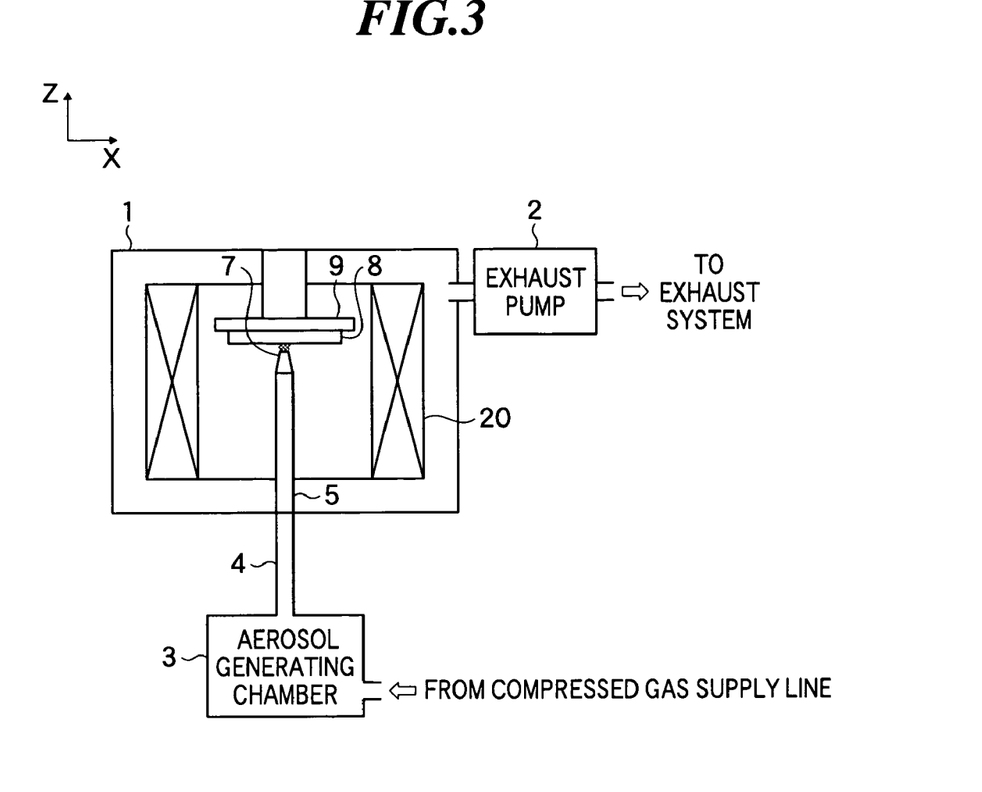
FIG. 3 shows a modified example of the film forming apparatus shown in FIG. 1.
Figure 4:
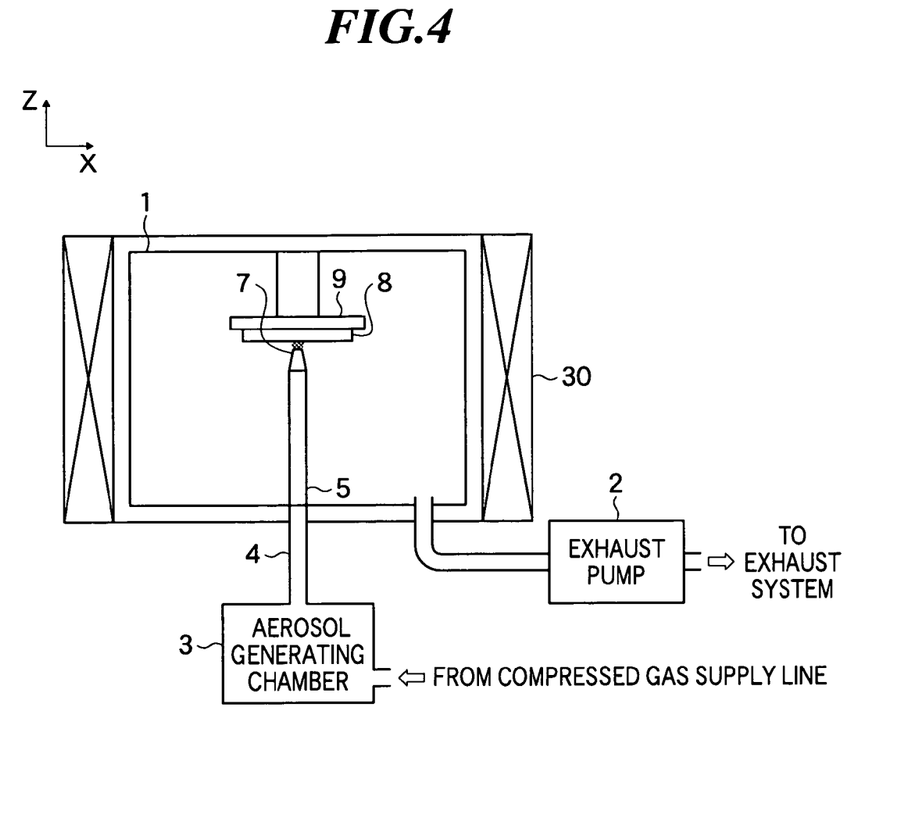
FIG. 4 shows another modified example of the film forming apparatus shown in FIG. 1.

Further, in the film forming apparatus shown in FIG. 1, the superconducting coil 6 is provided around the accelerating tube 5, however, the position of the superconducting coil is not limited to the position shown in FIG. 1 as long as a magnetic field can be formed in a region including the flow path of aerosol. For example, as shown in FIG. 3, a superconducting coil 20 may be provided around the accelerating tube 5 and the substrate 8. In this case, a magnetic field is also formed in a region containing the substrate 8, and thereby, the raw material powder is subjected to the action of strong magnetic field until immediately before attaching the substrate 8. As a result, crystal orientation can be further improved. Further, as shown in FIG. 4, a superconducting coil 30 may be provided outside of the chamber 1. In this case, there is a merit that handling of the superconducting magnet including the superconducting coil 30 becomes easier.

Next, a modified example of the film forming apparatus according to the embodiment will be described by referring to FIGS. 5 to 8.

Figure 5:
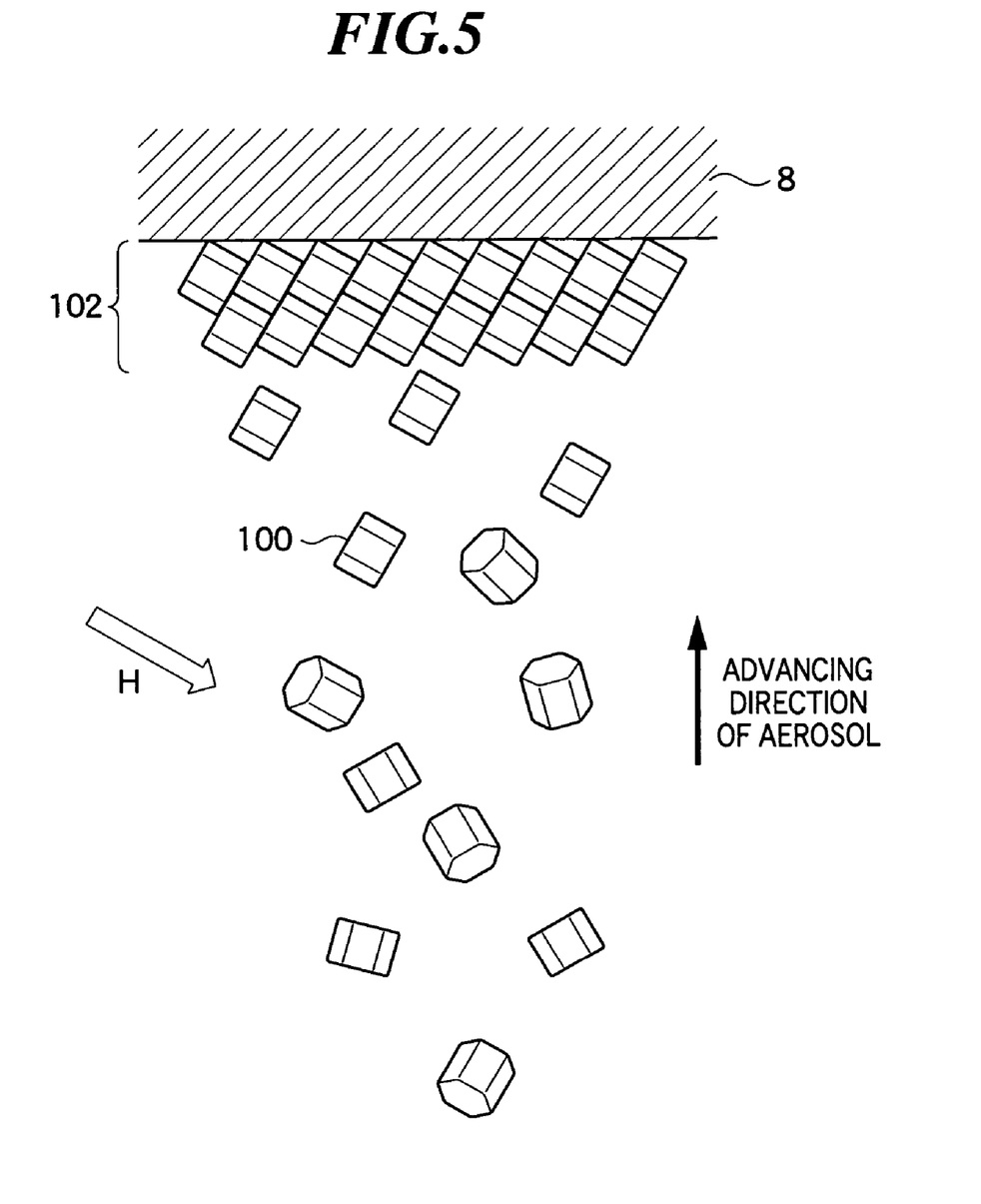
FIG. 5 is a diagram for explanation of the principle of changing crystal orientation of a film formed on a substrate.
Figure 6:
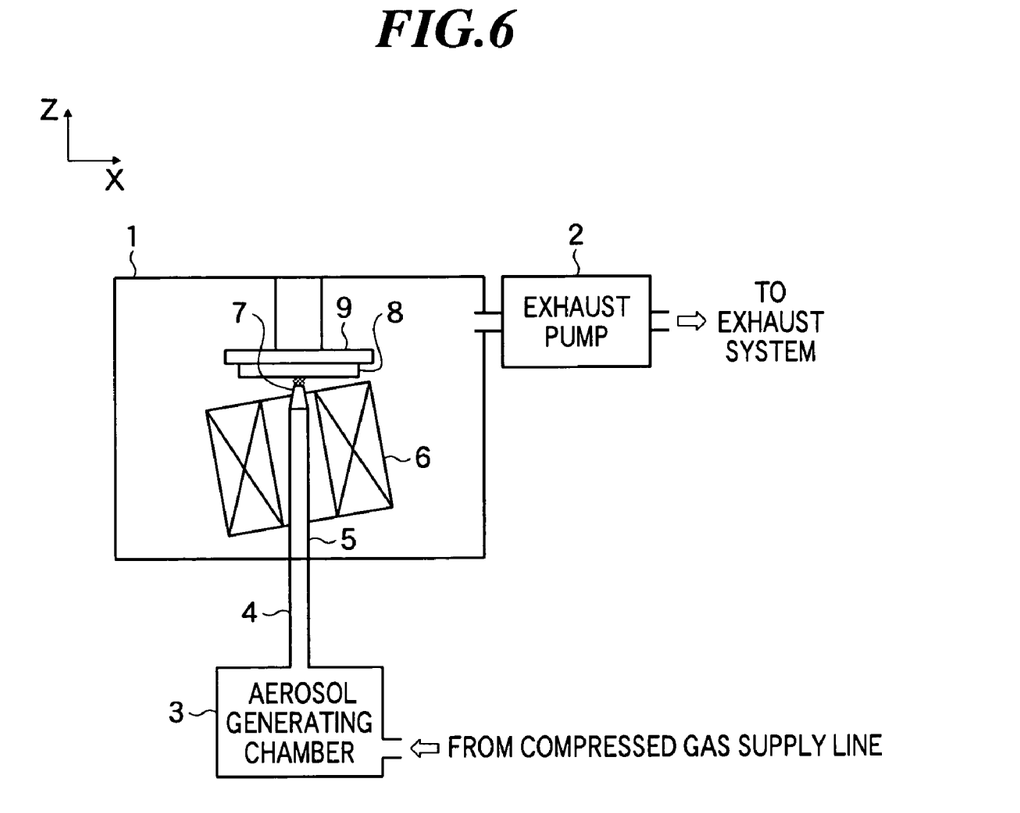
FIG. 6 is a schematic diagram showing an example of changing the orientation of a magnetic field relative to the advancing direction of an aerosol in the film forming apparatus.
Figure 7:
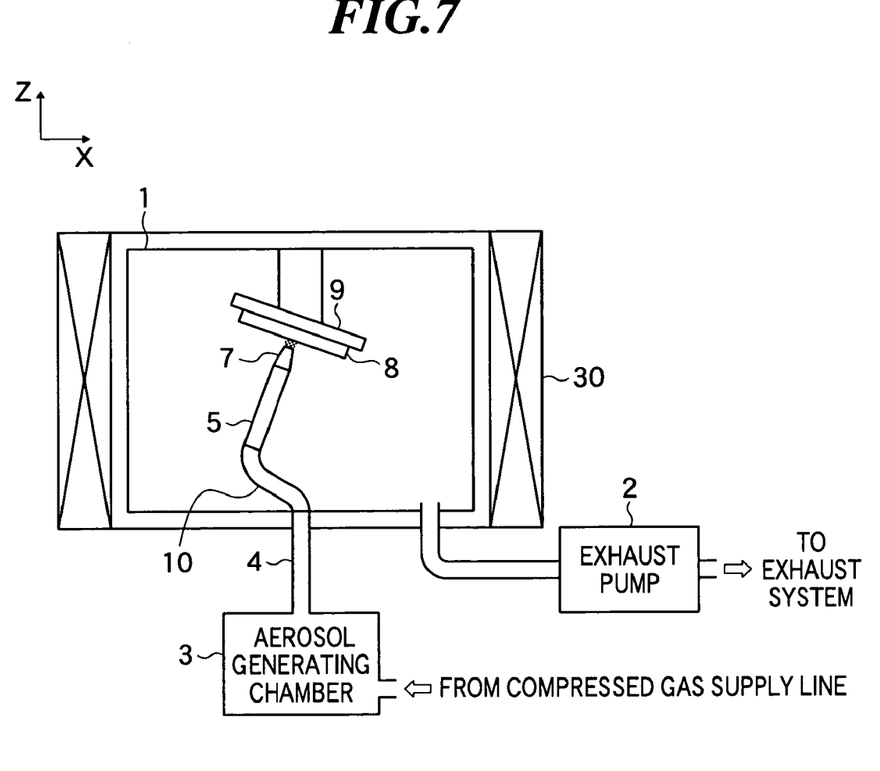
FIG. 7 is a schematic diagram showing another example of changing the orientation of a magnetic field relative to the advancing direction of an aerosol in the film forming apparatus.

As shown in FIG. 5, the crystal orientation of a film 102 to be formed on the substrate 8 can be changed by varying a relative angle of the magnetic field (H) to the advancing direction of aerosol (i.e., attachment surface of the substrate). For that purpose, as shown in FIG. 6, the orientation of the superconducting coil 6 relative to the accelerating tube 5 may be inclined to a desired angle. Alternatively, as shown in FIG. 7, the accelerating tube 5 to which the injection nozzle 7 is attached and the substrate stage 9 holding the substrate 8 may be inclined to a desired angle in a magnetic field formed by the superconducting coil 30. In this case, the aerosol transport tube 4 and the accelerating tube 5 may be connected by a flexible elastic member 10. In order to effectively utilize the kinetic energy of the raw material powder when the raw material powder is deposited on the substrate 8, the relative angle between the injection nozzle 7 and the substrate 8 is desirably maintained within a predetermined range (e.g., around 90°).

Figure 8:
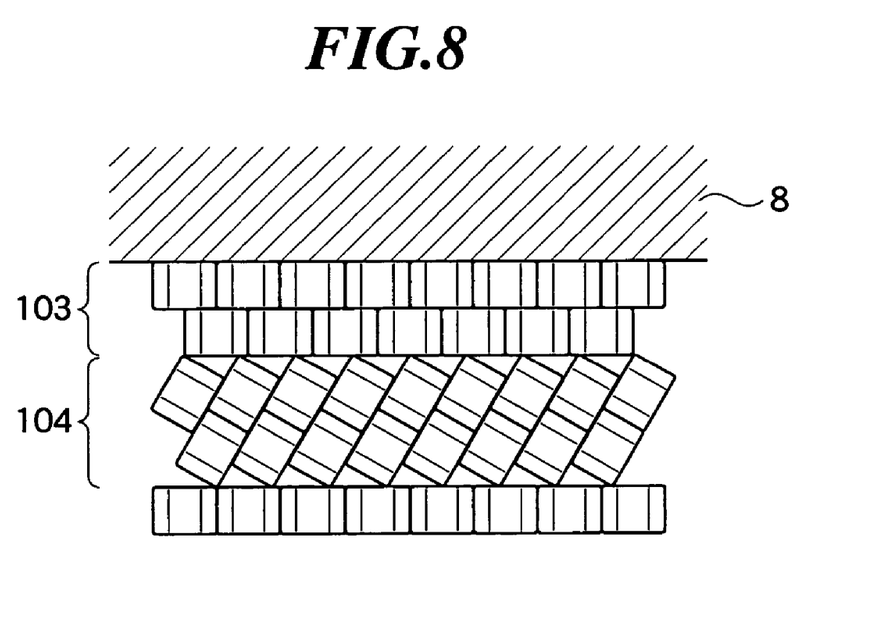
FIG. 8 is a schematic diagram showing a functional material in which plural layers having different crystal orientations are stacked.

Furthermore, by changing the relative orientation between the advancing direction of aerosol and the magnetic field according to the film thickness formed on the substrate 8 (height from the substrate) in the film forming apparatus shown in FIG. 6 or 7, a functional material can be formed in which plural layers 103, 104, . . . having different crystal orientations are stacked as shown in FIG. 8.

Figure 9:
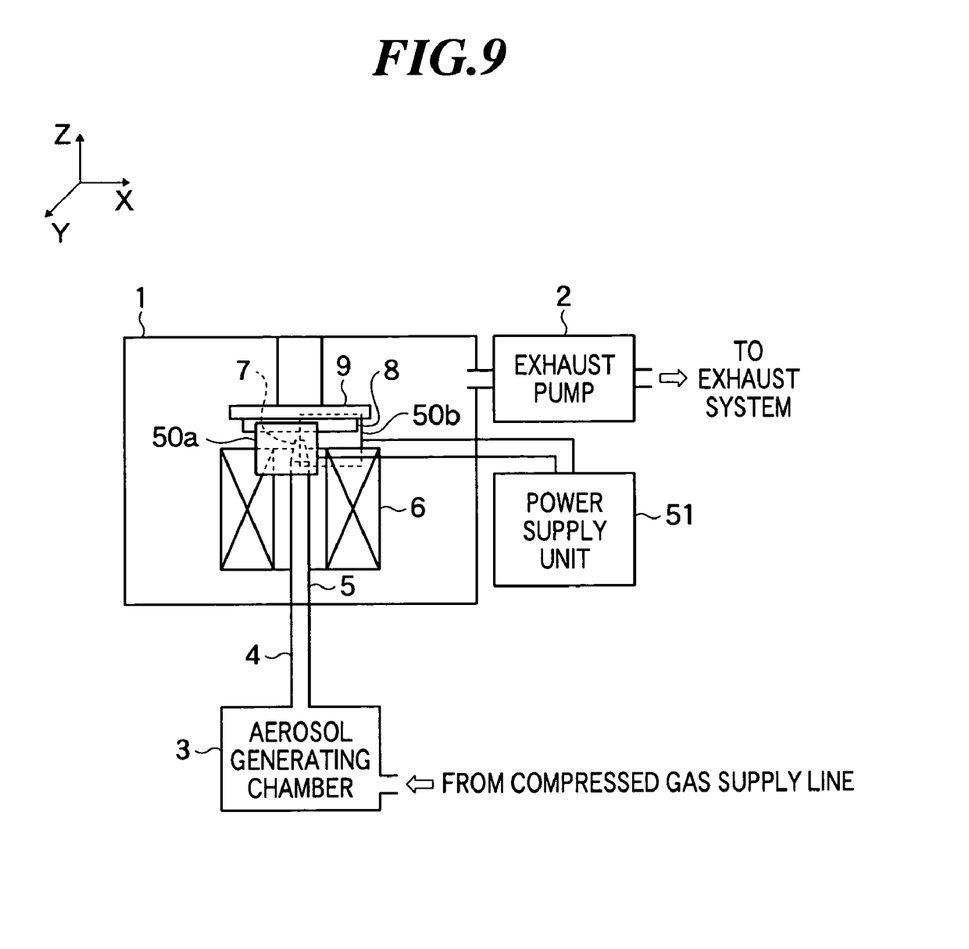
FIG. 9 is a schematic diagram showing a film forming apparatus according to the second embodiment of the present invention.

Next, a film forming apparatus according to the second embodiment of the present invention will be described by referring to FIGS. 9 to 10B. FIG. 9 is a schematic diagram showing a constitution of the film forming apparatus according to the embodiment.

The film forming apparatus shown in FIG. 9 has electrodes 50a and 50b and a power supply unit 51 in addition to the film forming apparatus shown in FIG. 1. The electrode 50a and the electrode 50b are oppositely located with the flow path of the aerosol injected from the injection nozzle 7 in between. The power supply unit 51 provides a potential difference between the electrode 50a and the electrode 50b so as to form an electric field in a predetermined direction (Y-direction in FIG. 9) in a region including the flow path of the aerosol. Other constitution is the same as that of the film forming apparatus shown in FIG. 1.

Figure 10A:
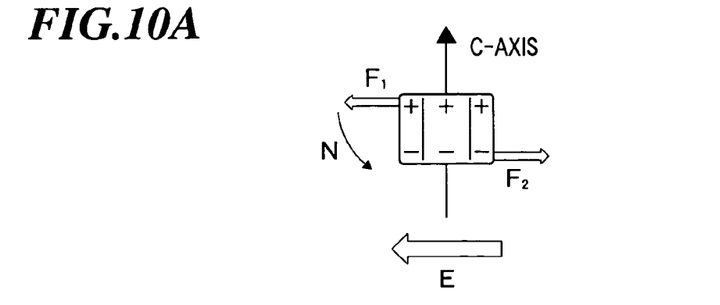
FIGS. 10A and 10B are diagrams for explanation of the principle of a film forming method used in the film forming apparatus shown in FIG. 9.
Figure 10B:
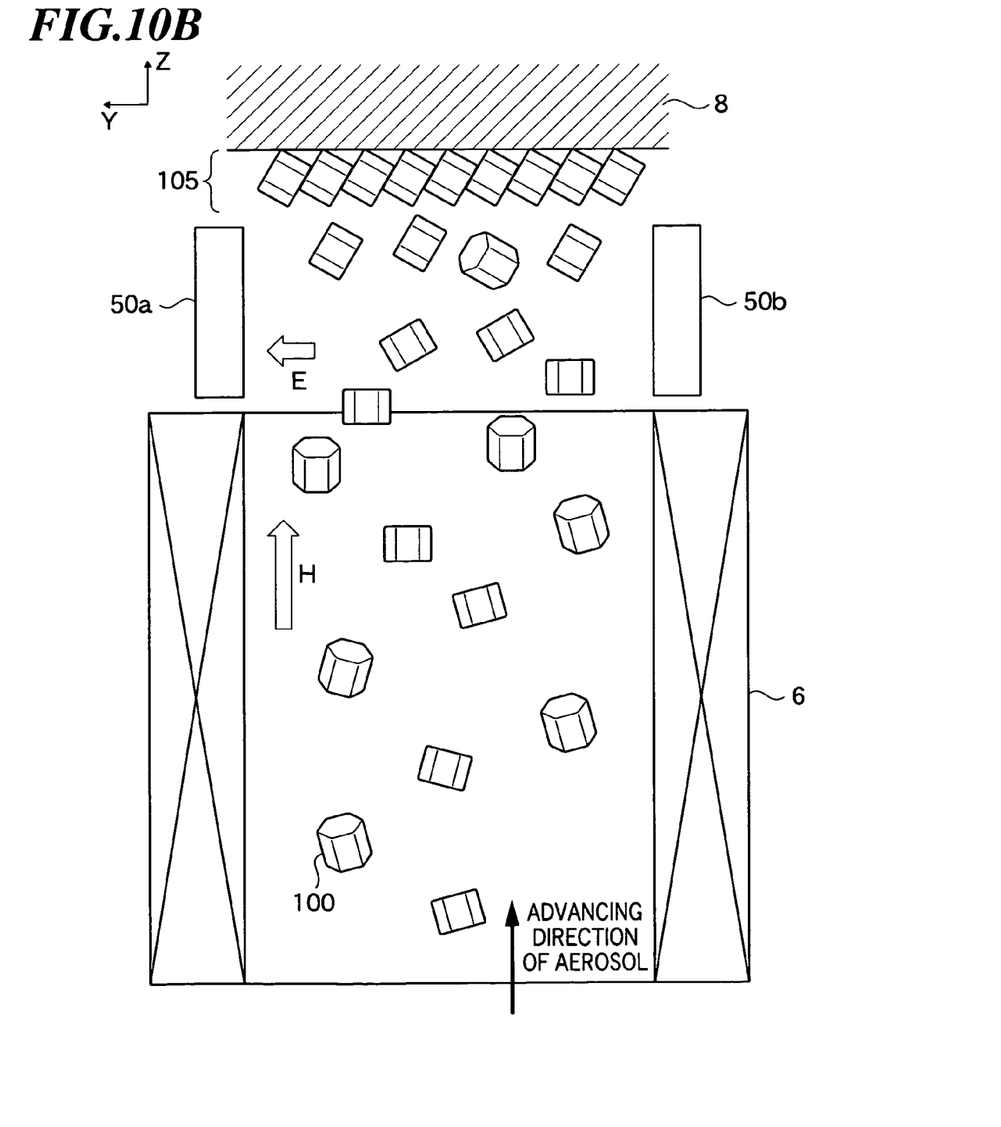

FIGS. 10A and 10B are diagrams for explanation of the principle of a film forming method to be used in the film forming apparatus according to the embodiment.

As shown in FIG. 10A, generally, a raw material powder 100 as monocrystals is polarized in a crystal axis direction. Accordingly, when electric field (E) is applied to the raw material powder 100, the raw material powder 100 is subjected to Lorentz force (couple of force) $F_1$ and $F_2$ (where $F_2 = -F_1$) according to the magnitude of polarized charge and electric field (E). As a result, torque (N) for rotating the raw material powder 100 in a direction of an arrow as shown in FIG. 10A is produced. Accordingly, as shown in FIG. 10B, the electric field (E) formed by the electrode 50a and the electrode 50b is applied to the raw material powder 100 in which the crystal orientation is aligned by being applied with the magnetic field (H) formed by the superconducting coil 6. Thereby, the crystal orientation of the raw material powder 100 changes by a predetermined amount in a predetermined direction, and a film 105 is formed in which crystals are oriented in the predetermined direction. Here, it is possible to control the direction, in which the crystal orientation of the raw material powder 100 is changed, and the amount of change by adjusting the magnitude of the electric field (E), location of the electrodes 50a and 50b, and a length at which the aerosol passes through the electric field E (i.e., the lengths of the electrode 50a and the electrode 50b).

By the way, since the aerosol is a two-phase flow including a gas phase and a solid phase, the raw material powder 100 contained therein is easily charged by friction. Accordingly, the crystal orientation of the raw material powder 100 may be changed by the influence of Lorentz force produced by the interaction between the charge of the raw material powder 100 and electric field (E).

In the embodiment, the electric field is applied to the aerosol after being applied with the magnetic field, however, the electric field and the magnetic field maybe simultaneously applied or the magnetic field may be applied to the aerosol after being applied with the electric field by changing the location of the electrodes 50*a* and 50*b*.

As described above, in the first and second embodiments of the present invention, the gas is introduced into the container, in which the raw material powder is accommodated, so as to blow up the raw material powder and generate the aerosol. However, an aerosol generating method to be used in the prevent invention is not limited to such a method. For example, an aerosol may be generated by introducing the raw material powder into a container in which a current of air is formed.

The invention claimed is:

1. A film forming method comprising the steps of:

(a) generating an aerosol by dispersing a raw material powder into a gas;

(b) applying a magnetic field to a flow path of the aerosol generated at step (a) so as to orient crystal orientation in the raw material powder in an aerosol state; and (c) spraying the aerosol applied with the magnetic field at step (b) to said substrate so as to deposit the raw material powder, in which the crystal orientation is oriented, on a substrate.

2. A film forming method according to claim 1, wherein step (b) includes applying a magnetic field to the aerosol such that magnitude of magnetic anisotropic energy is determined based on magnetic susceptibility of said raw material powder and magnitude of the applied magnetic field becomes larger than thermal perturbation energy in said raw material powder.

3. A film forming method according to claim 1, further comprising the step of:

applying an electric field to the flow path of the aerosol generated at step (a) so as to change the crystal orientation of the raw material powder in the aerosol state.

4. A film forming method according to claim 2, further comprising the step of:

applying an electric field to the flow path of the aerosol generated at step (a) so as to change the crystal orientation of the raw material powder in the aerosol state.

5. A film forming method according to claim 1, wherein step (a) includes generating an aerosol by accommodating a raw material powder in a container and introducing a carrier gas into said container to disperse the raw material powder therein.

6. A film forming method according to claim 1, wherein said raw material powder comprises PZT (Pb, zirconate titanate).

7. A film forming method according to claim 1, wherein said raw material powder comprises $TiBaO_3$ (barium titanate).

8. A film forming method according to claim 1, wherein said gas comprises at least one of nitrogen, oxygen, helium, argon and air.

* * * * *